(12) United States Patent
Keese et al.

(10) Patent No.: US 8,674,782 B2
(45) Date of Patent: Mar. 18, 2014

(54) RF IMPEDANCE DETECTION USING TWO POINT VOLTAGE SAMPLING

(75) Inventors: William O. Keese, Auburn, WA (US);
Saša Radovanović, Rotterdam (NL);
Daniel L. Simon, Phoenix, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 522 days.

(21) Appl. No.: 13/065,881

(22) Filed: Mar. 31, 2011

(65) Prior Publication Data
US 2012/0249259 A1 Oct. 4, 2012

(51) Int. Cl.
*H03H 7/38* (2006.01)

(52) U.S. Cl.
USPC ........................................ 333/17.3

(58) Field of Classification Search
USPC .................................. 333/17.3, 32
See application file for complete search history.

(56) References Cited

U.S. PATENT DOCUMENTS

| | | |
|---|---|---|
| 6,862,432 B1 | 3/2005 | Kim |
| 2003/0052832 A1 | 3/2003 | Alexopoulos |
| 2009/0258614 A1 | 10/2009 | Walker |
| 2010/0182216 A1 | 7/2010 | Schmidhammer |

*Primary Examiner* — Stephen Jones
(74) *Attorney, Agent, or Firm* — Eugene C. Conser; Wade J. Brady, III; Frederick J. Telecky, Jr.

(57) ABSTRACT

An adaptive impedance matching module having an adjustable impedance matching network with an input for receiving an RF power source and an output to be connected to an antenna, and first and second voltage measurement device configured to sense a voltage at respective first and second nodes on the impedance matching network. A network adjuster circuit is provided to switch the impedance matching network between a first state where first and second voltages are sensed on the respective first and second nodes and a second state where third and fourth voltages are sensed on the respective first and second nodes. Processing circuitry is provided which determines the matched load impedance based upon the first, second, third and fourth sensed voltages and including matching adjustment circuitry configured to adjust the matching impedance in the event the matched load impedance differs from a target load impedance by more that a predetermined amount.

18 Claims, 6 Drawing Sheets

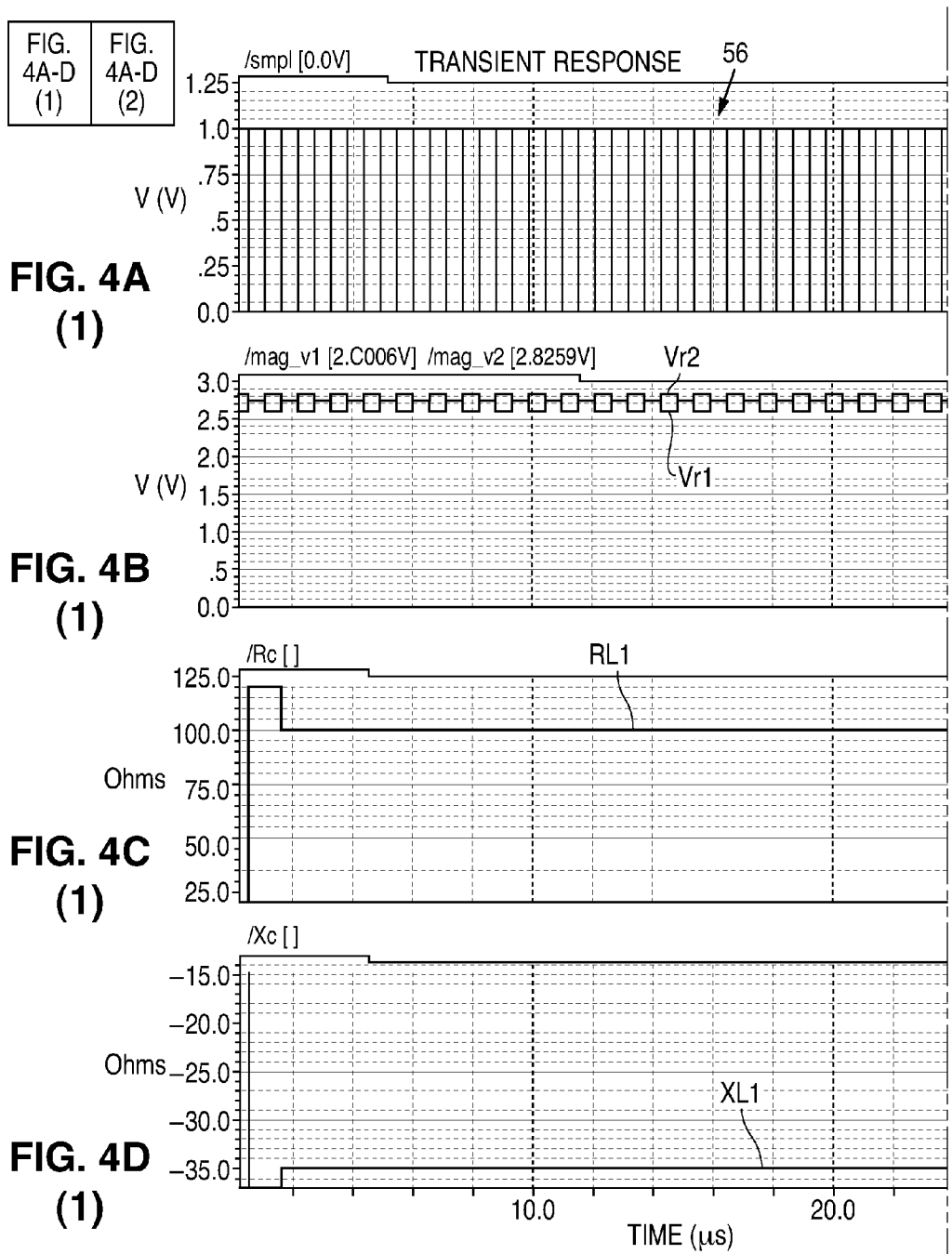

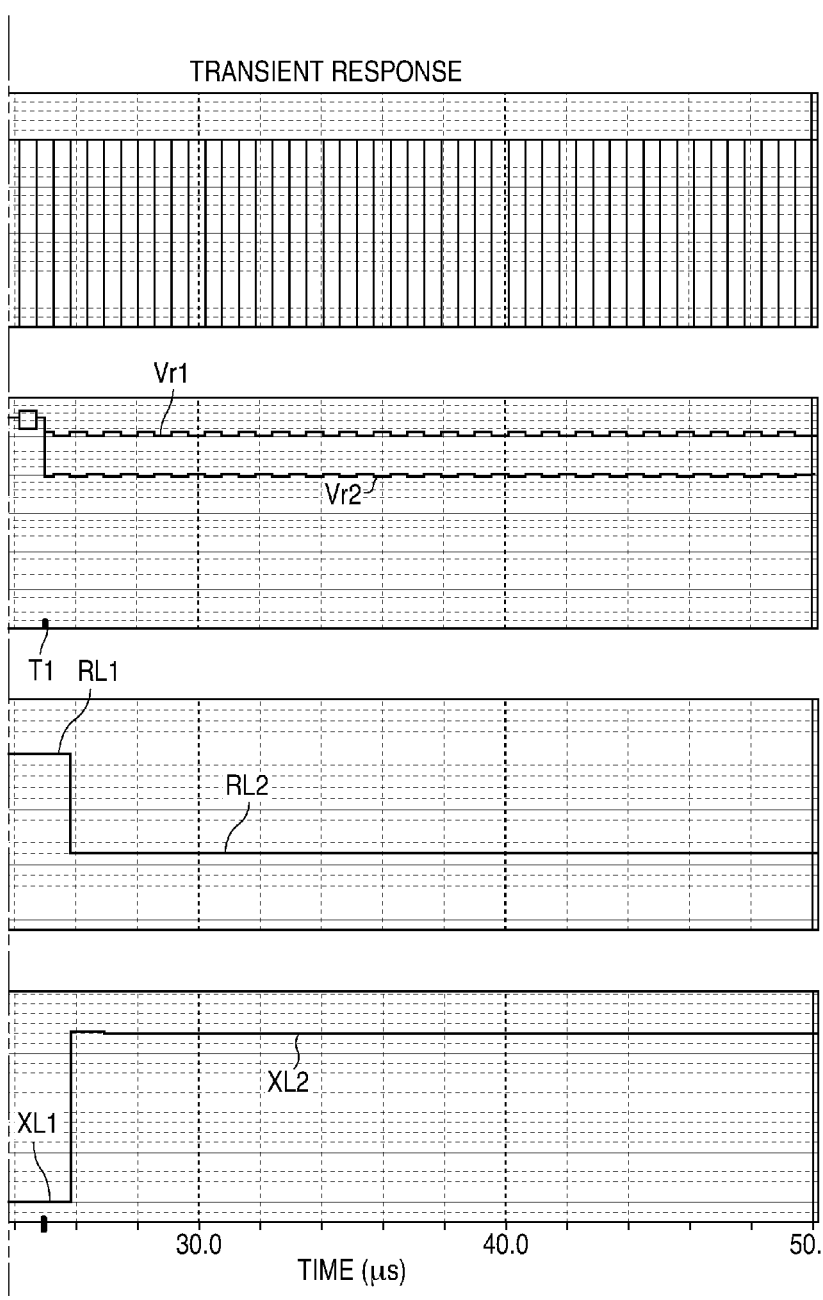
FIG. 4A (2)
FIG. 4B (2)
FIG. 4C (2)
FIG. 4D (2)

US 8,674,782 B2

RF IMPEDANCE DETECTION USING TWO POINT VOLTAGE SAMPLING

BACKGROUND OF THE INVENTION

1. Field of the Invention

The present invention relates generally to RF impedance measurement and in particular to RF impedance measurements using two point voltage sampling without a phase detector. Some embodiments also relate to adjusting an impedance matching network after the measurement.

2. Description of Related Art

Mobile handsets such as cellular phones are being manufactured using higher levels of integration and use in broader frequency band coverage. As a result, the performance limits of embedded antenna technology are being stretched. Variations in load impedance at the antenna due to environmental changes such as the position at which the phone is held, the frequency band being used and other contributors create a mismatch or increased voltage standing wave ratio (VSWR) at the antenna port. In addition, the body effects of a head or hand near the antenna contribute to capacitive loading which also results in an impedance mismatch. This can lead to a shift in antenna center frequency and an increased VSWR mismatch. In addition to reception problems, any mismatch will further result in a reduction in power radiated from the antenna.

FIG. 1 depicts a prior art RF system which includes an adaptive impedance matching network. The system includes an RF power amplifier PA 20 having an output coupled to the input of a duplexer 22. The duplexer directs the RF signal from amplifier 20 to the system antenna 24 by way of the adaptive impedance matching network 26. Duplexer 22 further channels RF signals received on the antenna to a system receiver (not depicted). The adaptive impedance matching network includes a tunable impedance matching network 30 which matches the impedance of the antenna to some target value that matches that of the duplexer. Typically, an antenna impedance has a real component Rant ranging from 30 to 100Ω and a reactive component j Xant of 0 to +100 jΩ. The matching network converts the antenna impedance to some target impedance such as an impedance matching that of the coupler 28.

The antenna impedance Zant can change, as previously noted, due to a change in the physical environment surrounding the antenna. The impedance at the input of the tunable matching network 30 is monitored by periodically measuring the amplitude of the RF voltage at the input and output of the directional coupled 28 using respective peak detectors 32A and 32B. The phase relationship between the two detected voltages is measured using a phase detector 34. The peak voltage measurements and the phase measurement are then provided to a processing device 36 such as a digital signal processor to compute the impedance. In the event the measured impedance differs from the target impedance due to a change, by way of example, in the antenna characteristics, the processor adjusts the tunable matching network 30 as needed to return to the target impedance.

The above-described approach requires an impedance sensing section which is separate from the impedance matching section. In addition, a phase detector is used. A phase detector having good accuracy and low current is difficult to achieve over the 690 Mhz to 2690 Mhz range of interest in many cell phone applications. As will become apparent to those skilled in the art upon a reading of the following Detailed Description of the Invention together with the drawings, an RF impedance improved detection scheme is disclosed which does not rely upon a phase detector and which does not require a sensing element separate from the matching network.

BRIEF DESCRIPTION OF THE DRAWINGS

FIGS. 4A-4D are timing diagrams of a simulation further illustrating the operation of the FIG. 2 embodiment.

DETAILED DESCRIPTION OF THE INVENTION

Figure 1:
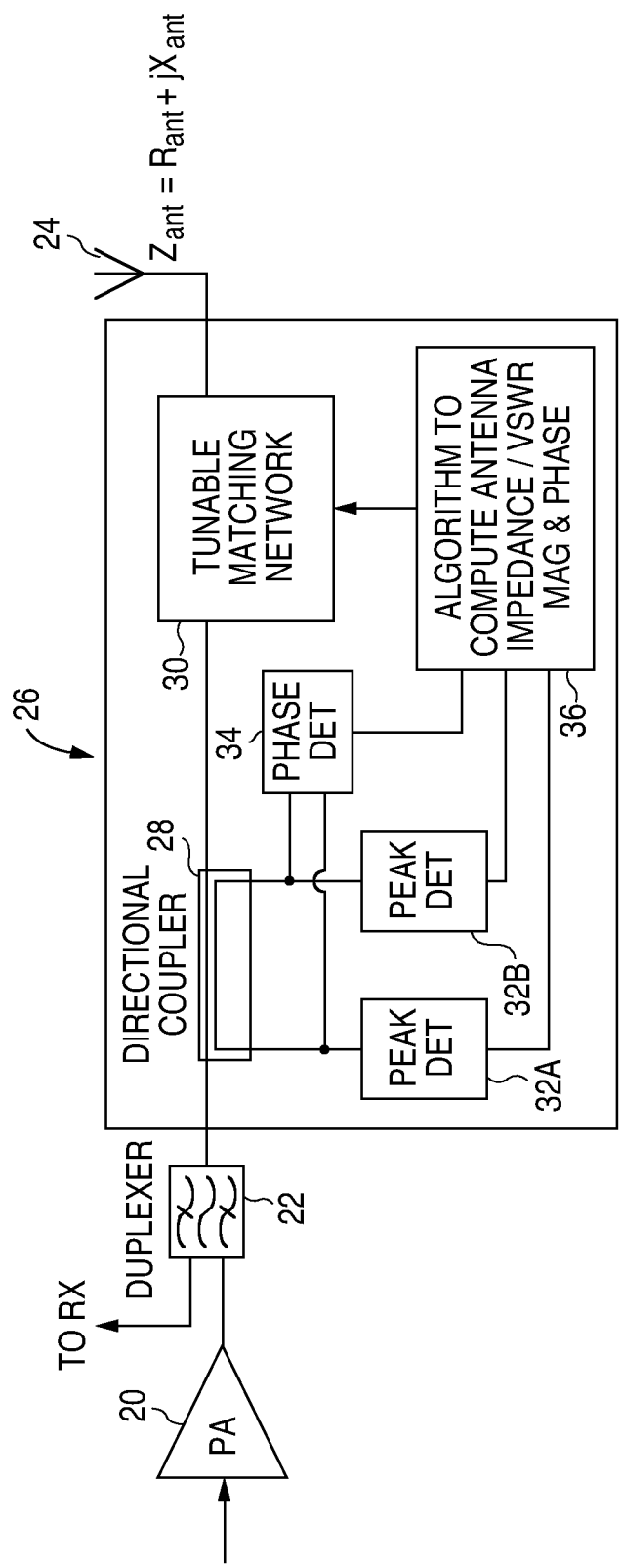
FIG. 1 is a diagram of a prior art RF system which incorporates an adaptive impedance matching network to compensate for changes in an antenna impedance.
Figure 2:
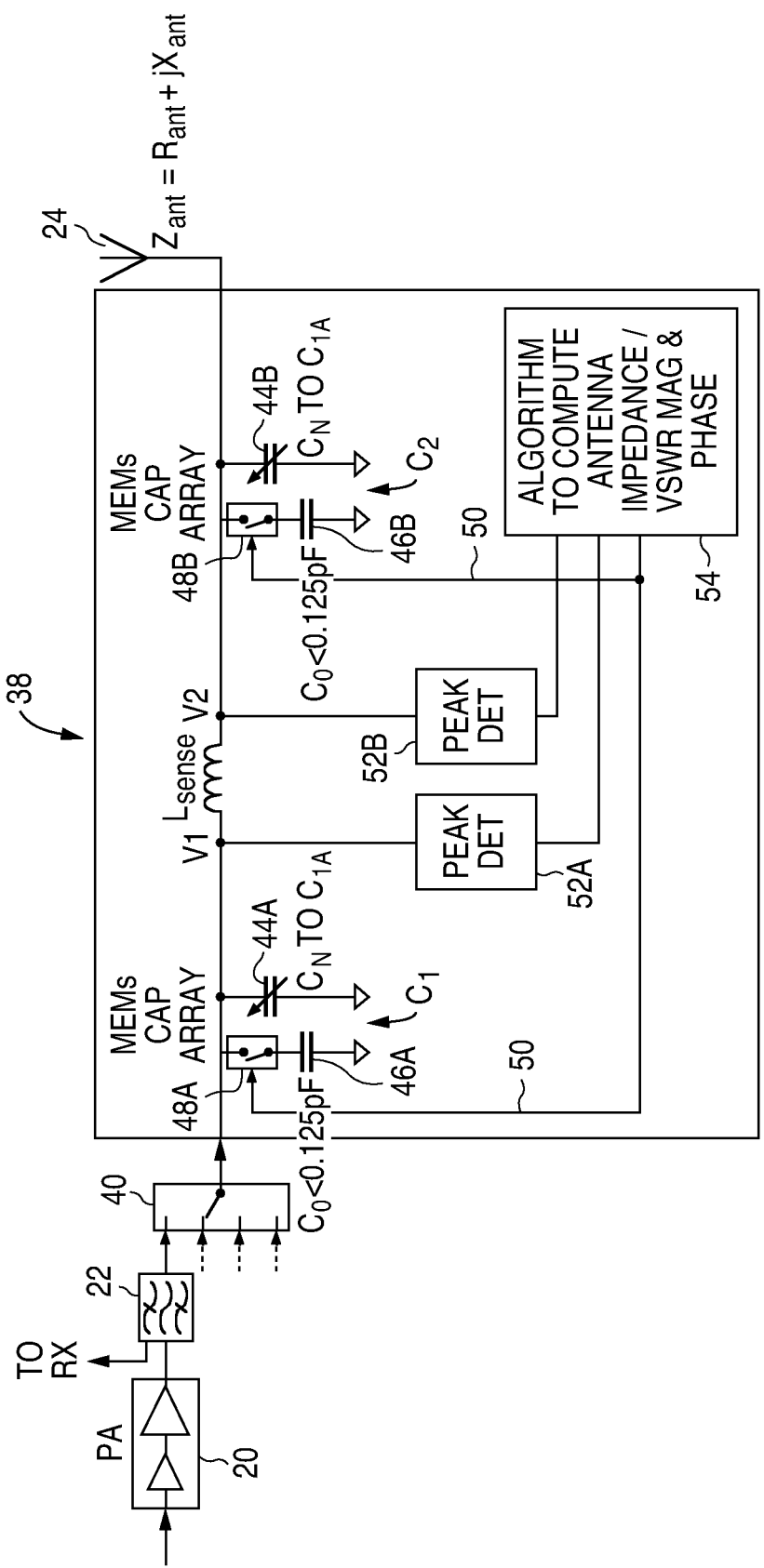
FIG. 2 is a diagram of an RF system which includes an adaptive impedance matching network in accordance with one embodiment of the present invention.

Referring again to the drawings, FIG. 2 shows an adaptive RF matching network module 38 in accordance with one embodiment of the present invention. An RF power amplifier 20 is coupled to a first port of the network module 38 by way of a duplexer 22 followed by an RF switch 40 which switches between various transceiver paths to accommodate various mobile communication standards such as GSM, WCDMA, LTE, etc. Another port of the network module 38 is for connecting to an antenna 24. Antenna 24 functions to radiate the RF energy from the amplifier 20 and to receive RF signals which are provided to receiver circuitry by way of the duplexer 22. In many applications such as cellular phones, antenna 24 is a narrow bandwidth miniaturized antenna having a high Q. As a result, the antenna is subject to detuning due to fluctuating body effects and changes in the handset form factor. This detuning has an adverse effect on transmitted radiated power efficiency and over the air receiver sensitivity.

The adaptive matching network module 38 initially transforms the impedance of the antenna 24 to a target impedance which may be, by way of example, a 50Ω real impedance. Environmental fluctuations may cause the impedance of antenna 24 to change so that the matching network is no longer optimal. As will be described, the adaptive matching network module 38 monitors the impedance of the matched network and, if the impedance varies from the target value, will adjust the matching network so that the impedance is returned to the target value.

The exemplary matching network used in module 38 is a pi type network which includes a series connected inductor Lsense and a pair of shunt connected capacitor arrays $C_1$ and $C_2$ disposed on either side of the inductor. The capacitor arrays each include an array 44A and an array 44B of RF-MEMS (micro-electromechanical system) capacitive switches Cn to C1a. The capacitive switches are preferably disposed in a binary weighted manner, with there being five capacitive switches connected in parallel, with the relative capacitive values being C, 2C, 4C, 8C and 16C. The five capacitive switches are individually enabled and disabled to provide a total capacitance ranging from C to 31C in increments of C. As is well known, high voltage switching circuitry (not depicted) is used to control the state of each of the five switches. Lsense has a typical inductance of 2 to 8 nano-Henries, with the value of C of the capacitive switches being 0.5 to 4.0 pF. Each capacitor bank further includes a small (Co<0.125 pF) switched capacitor which is periodically connected in parallel with each of the MEMS capacitive switches 44A and 44B. The smaller the value of Co, the greater the voltage detection accuracy required of the RF detectors employed as peak detectors 52A and 52B to be described. A dither clock present on line 50 is used to control the states of switches 48A and 48B which operate to switch capacitors Co in circuit and out of circuit. The frequency of the dither clock is determined by the required response time of the RF impedance measurement, which may be as low as a 100 Hz or up to around 1 MHz. Preferably the dither frequency is not so high as to introduce spikes on the RF sensing lines.

In addition to forming part of the impedance matching, inductor Lsense also functions as part of the impedance sensor. A pair of peak voltage detectors 52A and 52B are connected to detect respective voltages V1 and V2 at opposite ends of inductor Lsense. The voltages are periodically sensed when the switched capacitors 46A and 46B are connected in circuit by switches 48A and 48B and then sensed a second time when the capacitors are switched out of circuit. As will be explained, these four voltage measurements permit the impedance looking into the matching network to be determined. In the event that measured impedance is out of range, the matching network is adjusted by way of capacitor switches 44A and 44B to bring the impedance back into range. A control block 54 provides various control functions, including the production of the dither clock on line 50, control of the peak detectors 52A and 52B, the computation of the actual network impedance and the re-adjustment of the adaptive matching network to bring the impedance back into range.

Note that FIG. 2 shows a pair of dither caps 46A and 46B having a value CO. Dither cap 46A can be used to determine some useful information regarding the matching network and antenna 24. However, the following description and analysis is based upon the use of dither cap 46B alone.

Figure 3:
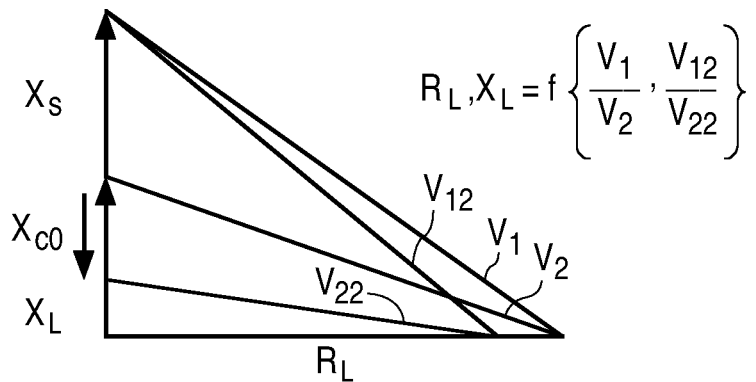
FIG. 3 is a phasor diagram illustrating part of the operation of the FIG. 2 embodiment and which does not rely upon the use of a phase detector.

FIG. 3 is a phasor diagram (not to scale) illustrating the manner in which the four measurements can be used to determine the impedance $Z_L$, which is the impedance looking from the node where V2 is sampled towards the antenna 24 impedance. Thus, $Z_L$ is the parallel combination of the matching network output capacitance $C_2$ (sum of parallel capacitors 44B and 46B) and the antenna impedance $Z_{ant} = R_{ant} + j X_{ant}$. Impedance $Z_L$ can be expresses as follows:

$$Z_L = R_L + j X_L \quad (1)$$

Voltages V1 and V2 are measured using respective peak detectors 52A and 52B when switch 48B is opened based upon the polarity of the dither clock on line 50 so that dither capacitor 46B (Co) is out of circuit. Thus, it can be seen from the FIG. 3 diagram where V1 and V2 can be plotted on the complex plane showing that the difference between the two voltages is $X_S$ which represents the impedance of the sense inductor Lsense. After the first measurements are made, the dither clock then closes switch 48B so that capacitor 46B is connected in circuit. Voltages V12 and V22, which correspond to V1 and V2 for the previous measurement, are then measured using the respective peak detectors 52A and 52B. These two voltages V12 and V22 can also be plotted on the complex plane along with V1 and V2. The difference between these voltages is represented by the impedance $X_S$ of the sense inductor Lsense less the impedance Xco of the switching capacitor 46B. Inspection of the FIG. 3 diagram indicates that the values $R_L$ and $X_L$ of the impedance $Z_L$ (which includes the antenna impedance $Z_{ant}$ as one component) can then be ascertained without the use of a phase detector.

The value of $Z_L$ is preferably determined using signal processing circuitry disposed within control unit 54. The phase angle φ is expressed as follows:

$$\cos \phi = -0.5[Xdp^2(Vr1^2 - Vr2^2) + X_S^2]/(X_S \cdot Xdp \cdot Vr1) \quad (2)$$

where,
Vr1 is the ratio of V1/V2;
Vr2 is the ratio of V12/V22;
Xdp is the impedance of the dither cap 46B; and
$X_S$ is the impedance of inductor Lsense.

Once the phase angle is known, the reactive component $X_L$ and real component $R_L$ of the impedance $Z_L$ can be calculated as follows:

$$X_L = (X_S/2)[(Vr1^2 - 1)/(Vr1^2 + 1 - 2Vr1 \cos \phi) - 1] \quad (3)$$

and $$R_L = [X_S^2/(Vr1^2 + 1 - 2Vr1 \cos \phi) - X_L^2]^{1/2} \quad (4)$$

Assuming that the value of $Z_L$ has moved away from the target value because, for example, of changes in the antenna environment, the signal processor in the control unit 54 will proceed to alter the matching characteristics in the matching network. As will be described in greater detail, this is carried out by changing the value(s) of capacitors 44A and 44B.

FIGS. 4A-4D are timing diagrams further illustrating the operation of the subject impedance matching module 38. Waveform 56 of FIG. 4A represents the dither clock which causes the capacitor 46B (Co) (FIG. 2) to be switched into the matching network and to be switched out of the matching network. As previously described, when capacitor Co is present in the network, the two peak detectors 52A and 52B sense the peak voltages on opposite sides of inductor Lsense to determine V1 and V2. The ratio of V1/V2, value Vr1, is then produced. It would also be possible to produce the ratio Vr1 directly without having to determine the separate values of V1 and V2. When capacitor Co is switched out of the matching network, the peak voltages are sensed to determine the values of V21 and V22. The ratio Vr2 of V21/V22 is then determined.

A change in the antenna load impedance is simulated in the timing diagrams at a time T1=25 μs. Prior to that time, it can be seen from FIG. 4B that the ratio Vr1 is approximately 2.6 and the ratio Vr2 is approximately 2.8. The two ratios are then processed per equations (2), (3) and (4) by control unit 54 to produce a real component $R_{L1}$ and an imaginary component $X_{L1}$ of the impedance $R_L$. In this example, the initial impedance $Z_{L1}$ (which includes the antenna impedance $Z_{ant}$ as one component as previously noted) is as follows:

$$Z_{L1} = R_{L1} + j X_{L1} = 100 - j35.4 \, \Omega \quad (5)$$

The change in antenna impedance could be caused, by way of example, by a change in the antenna environment such as adjusting the manner in which a cell phone is held. As can be seen in FIG. 4B, the change in antenna impedance at time T1 is rapidly detected as evidenced by a change in the voltage ratios Vr1 and Vr2. Vr1 changed from about 2.6 to 2.5 and Vr2 changed from about 2.8. The control unit 54 then recalculates the new impedance values $Z_{L2}$, again using equations (2), (3) and (4), as follows:

$$Z_{L2} = R_{L2} + j X_{L2} = 50 - j17.7 \, \Omega \quad (6)$$

If it is assumed that the target impedance is reflected by equation (5) above, the control unit 54 will then precede to alter the matching network by way of the MEMS 44A and 44B so that the matched impedance has returned to the target impedance. One approach for adjusting the matching network will now be described. As will be seen, only the change in matching network capacitance to arrive at the target values is needed and not the actual final value of that capacitance.

Figure 6:
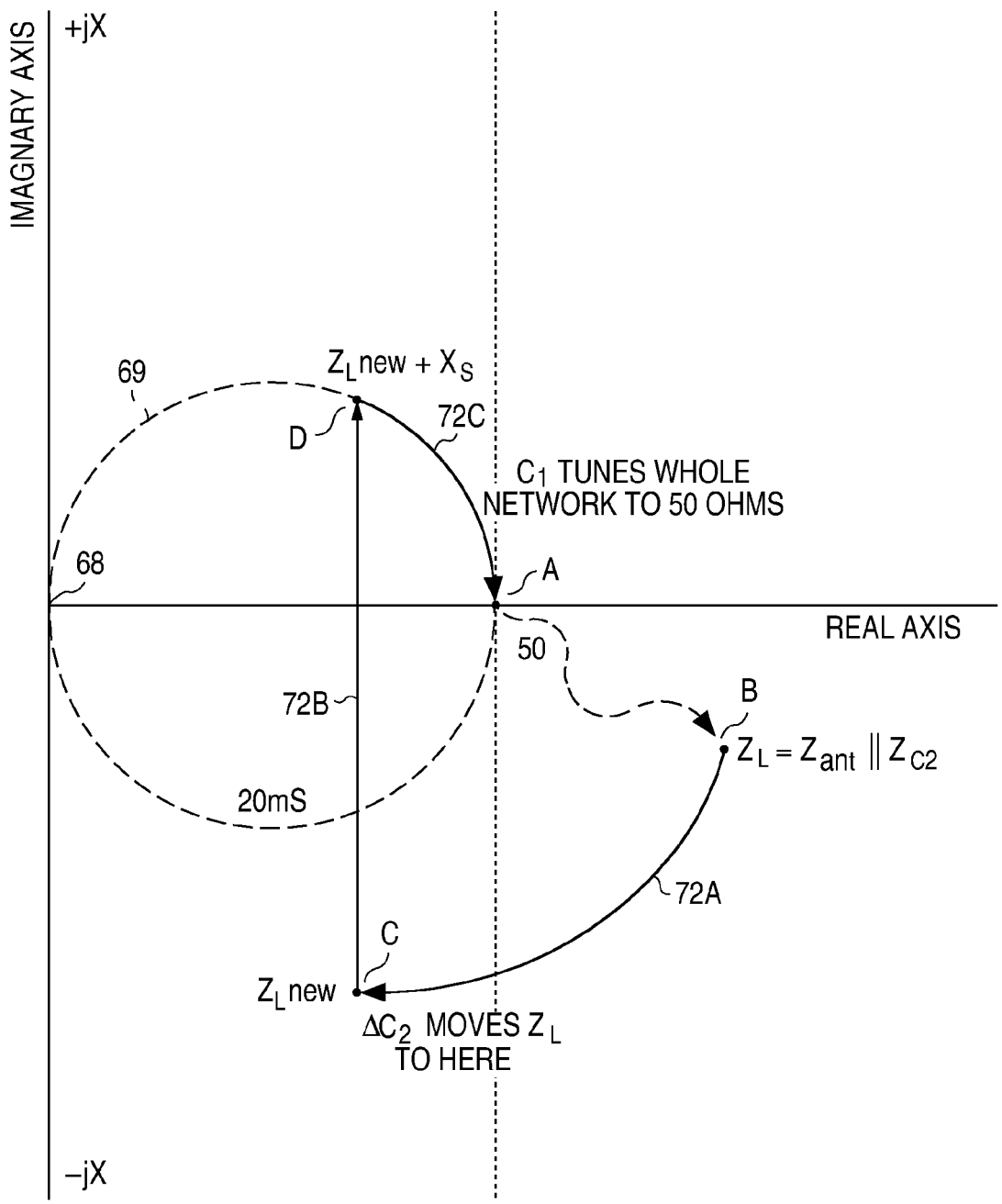
FIG. 6 is a plot of a complex plane showing the methodology of adjusting the matching network after a change in the antenna impedance is detected.

As was previously shown by equations (3) and (4), the values for $R_L$ and $X_L$ represent the respective real and imaginary components of the measured impedance. Using these values, the needed change in value of matching network capacitances 44A and 44B, the MEMS capacitor arrays, is determine using a signal processor or the like. A chart of the complex impedance plane is shown in FIG. 6 in order to illustrate the manner in which the impedance matching module 38 operates to compensate for changes in the impedance $Z_{ant}$ of antenna 24. In order to combine parallel components, it is preferred that the values be in terms of admittance so that values can be simply added together. Similarly, for series components, it is preferred that values be in terms of impedance so that they can also be combined by adding. The chart of FIG. 6 shows both approaches. When only an imaginary component of an admittance is being changed, the admittance moves along a constant conductance circle, with all of the circles intersecting at the origin 68.

Initially, assume that that the matching network is at the optimum value to transform the present antenna impedance $Z_{ant}$ to the optimum value in this example of in this example of 50+j0Ω purely real resistance. This condition is represented on the FIG. 6 chart at point A. As can be seen, point A lies of the real axis at the 50Ω point which falls on a constant conductance circle of 20 milli Siemens. If the antenna impedance $Z_{ant}$ is changed due to changes in the antenna environment for example, the antenna impedance $Z_{ant}$ will change. The impedance measured by the matching network module 38 is actually $Z_L$, the parallel combination of $Z_{ant}$ and impedance $Z_{C2}$ of capacitor $C_2$ of the matching network. Thus, when $Z_{ant}$ changes so does $Z_L$, as indicated by the transition from point A to point B of the FIG. 6 chart.

In order to return the altered impedance to the target impedance at point A, it is usually necessary to adjust both the value of capacitances $C_1$ and $C_2$ of the matching network. First, the value of $C_2$ is changed by $\Delta C_2$ to provide a new value of $Z_L$, referred to here as $Z_L$new. By adding a parallel reactance, the impedance moves along an arc 72A of a constant admittance circle from point B to point C. The distance and direction of the movement is a function of size of the change $\Delta C_2$ and the polarity. In the present example, the polarity is positive ($C_2$ is to be increased). The magnitude of $\Delta C_2$ is determined so that point C is at a location in the complex plane such that, when the fixed value inductor Lsense of impedance $X_S$ is added in series, the combined, new value of impedance will fall on the constant admittance circle 69 of 20 milli-Siemens. That value at point D is the sum of $Z_L$new plus $X_S$. At this point, a value of $C_1$ of the matching network is then produced which provides a reactance $X_1$ which is of a magnitude sufficient to move the impedance $Z_L$new plus $X_S$ to close to a pure resistance of 50Ω as represented by point A. Since the MEMS cap arrays 44A and 44B that make up the majority of respective capacitances C1 and C2 have only a finite number of possible values, the final impedance value may differ somewhat from the ideal value of 50Ω.

In order to carry out the above transformation, one approach is to first determine the change in capacitance $C_2$ to move from point B to point C of FIG. 6. The needed change in reactance $\Delta X_2$ can be determined as follows:

$$\Delta X_2 = -X_S[X_SX_L + R_L^2 + X_L^2 - (R_L(-X_SR_L50R_L^2 + 50X_L^2))^{1/2}]/[(X_L+X_S)^2 + R_L(R_L-50)] \quad (7)$$

where $X_S$ is the impedance of the inductor Isense;

$X_L$ is the measured reactive component of $Z_L$ per equation (3);

$R_L$ is the measured resistive component of $Z_L$ per equation (4); and the value 50 is target impedance in ohms.

Thus, the needed change to the present value of $C_2$ in order to move from point B to point C of FIG. 6 is as follows:

$$\Delta C_2 = -1/(\omega \Delta X_2) \quad (8)$$

where ω is the radial frequency 2nf.

The new value of $C_1$ needed to shift the full combined impedance (matching network+Zant) from point D back to point A is then determined. The equation for calculating the impedance $X_1$ provided by the new value of $C_1$ is set forth below. Variables Rn and $X_n$, to be defined later, are used to simplify the following equation for $X_1$.

$$X_1 = 5[10X_n + (-100R_n^2 + 2R_nX_n^2 + 2R_n^3)^{1/2}]/(R_n-50) \quad (9)$$

where, $R_n$ is a variable determined by equation (11) below; and $X_n$ is a variable determined by equation (12) below.

The new value of $C_1$ is then as follows:

$$C_1 = -1/(\omega X_1) \quad (10)$$

where ω is the radial frequency 2nf.

The values of variables $R_n$ and $X_n$ used in equation (9) are as follows:

$$R_n = (\Delta X_2^2 R_L)/[R_L^2 + (\Delta X_2 + X_L)^2] \quad (11)$$

and $$X_n = X_S + [R_L^2 \Delta X_2 + X_L^2 \Delta X_2 + X_L \Delta X_2^2]/[R_L^2 + (\Delta X_2 + X_L)^2] \quad (12)$$

where $X_S$ is the reactance of inductor Lsense;

$\Delta X_2$ is the reactance of $C_2$ per equation (7); and $R_L$ and $X_L$ are the real and imaginary parts of $Z_L$ per equations (3) and (4).

Thus, once the new value of $C_1$ of the matching network has been provided per equation (10), the impedance looking into the matching network on the $C_1$ side will have returned to point A of FIG. 6 which is at or near a pure resistance of 50Ω. Thus, once the actual values of C1 and C2 in the FIG. 2 impedance matching network have been updated, the impedance matching sequence is completed.

Note that MEMS switched capacitors 44A and 44B if FIG. 2 could be replaced with voltage controlled capacitances in the form of varactors. In that case, switched capacitors 46A and 46B can be eliminated. The impedance network changes in response to the dither clock are carried out by altering the magnitude of the varactor control signals in the form of a specific delta voltage to achieve the required difference in capacitance. That change in varactor capacitance can be used as value Xdp in equation (2) above to calculate $X_L$ and $R_L$.

Figure 5:
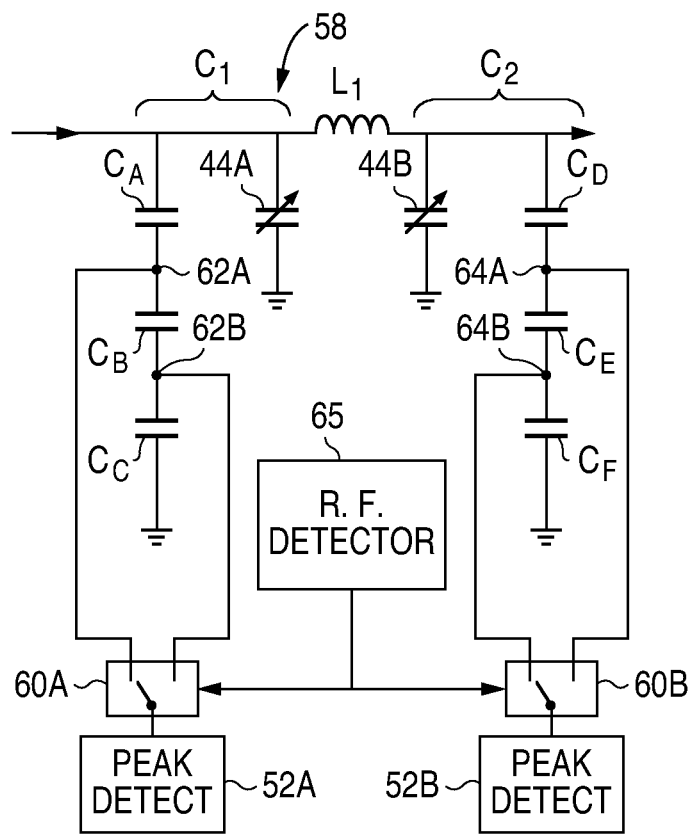
FIG. 5 is a diagram of showing an alternative embodiment that uses adjustable attenuator circuitry do reduce the dynamic range requirements of the voltage detectors.

FIG. 5 shows an alternative adaptive matching network module 58 which is similar to that of FIG. 2 in that a pi type architecture is used which includes a series inductor L1 flanked by a pair of parallel capacitor banks. A first one of the capacitor banks includes an array of capacitive MEMS switches 44A as used in the FIG. 2 embodiment along with three capacitors $C_A$, $C_B$ and $C_C$ connected in series with one another and in parallel with capacitive switches 44A. The other capacitor bank includes an array of capacitive MEMS switches 44B as used in the FIG. 2 embodiment and three capacitors $C_C$, $C_D$ and $C_E$ connected in series with one another and in parallel with capacitive switches 44B. In this embodiment, the dither cap (not explicitly depicted) is incorporated into the MEMS capacitive switch 44B. As previously noted, the MEMS switch can selectively connect capacitances C, 2C, 4C, 8C and 16C is parallel. The dither cap is switched in and out by switching the control signal to switch 44B so that the smallest capacitance value C is either in and out of circuit. Note that the dither cap 46B of the FIG. 2 embodiment may be implemented into MEMS capacitor array 44B and controlled in this same manner.

As can be seen in FIG. 5, each of the peak detectors 52A and 52B has an associated sensing node which can be changed in response to the state of switches 60A and 60B. Peak detectors typically have a limited input range over which they provide an accurate measurement. The dynamic range of the ratio V1/V2, which is value Vr1 of equation (2), can vary over 30 dB for antenna impedances equivalent of VSWRs of up to 8. Add to this the fact that the antenna output power can range from 0 to 30 dBm, the peak detector 52A and 52B sensors can have input dynamic range requirements of 60 dB which can be difficult to achieve.

FIG. 5 shows one approach for dealing with such a large input voltage dynamic range. Relatively small value capacitors $C_A$, $C_B$ and $C_C$ form a voltage divider, as do capacitors $C_D$, $C_E$ and $C_F$. Preferably corresponding capacitors $C_A$ and $C_D$ have the same value, and $C_B$ and $C_E$ each have the same value and capacitors $C_C$ and $C_F$. each have the same value. For relatively strong RF signals at the matching network, as determined by an RF detector 65, respective switches 60A and 60B connect nodes 62B and 64B as the detector sensing nodes for maximum attenuation. For relatively weaker signals, nodes 62A and 64A are selected for reduced attenuation. Thus, in addition to functioning as part of the matching network, capacitors $C_A$, $C_B$, $C_C$, $C_D$, $C_E$ and $C_F$ function together as a pair of adjustable attenuators. Since the attenuators do not include resistances, no loses result.

As previously noted, the impedance matching networks of FIGS. 2 and 5 are each pi type networks that include three primary impedance components including a series inductance flanked by a pair of parallel capacitances. Other types of matching networks can be used, but it is preferred that such networks include at least two primary impedance components (where either similar parallel or similar series components are combined into a primary component) and preferably at least three to provide a sufficiently wide range of impedance matching to cover essentially all possible impedance mismatches. On example of a two primary impedance components network would be the three component network of FIG. 2 with capacitances 46A/44A deleted. Although this matching network does not provide the same matching range as that of FIG. 2, it is very useful in those instances where a wide range of matching is not needed while still providing an impedance detection capability.

The RF detectors are implemented in both the FIG. 2 and FIG. 5 embodiments in the form of peak detectors 52A and 52B. However, rather than using peak detectors it would be possible to use any other types of detectors including RMS, linear and logarithmic. In addition, the greater the sensitivity of errors of the detected voltages V1 and V2 or V12 and V22 the greater is the required accuracy of the RF detectors. Conversely, the smaller the sensitivity of errors of the detected voltages the less accuracy is required of the RF detector.

Thus, various embodiments of an adaptive impedance network and associated circuitry have been disclosed. Although these embodiments have been described in some detail, certain changes can be made by those skilled in the art without departing from the spirit and scope of the present invention as defined by the appended claims.

What is claimed is:

1. An impedance matching module having a first port to be connected to an RF source and a second port to be connected to an antenna, said network comprising:
   an adjustable impedance matching network having an input coupled to the first port and a output coupled to the second port, said adjustable impedance matching network including at least two impedance components including at least one series component and at least one parallel component, with the adjustable impedance matching network having impedance matching characteristics which are adjustable in response to at least one control signal;
   a first voltage measurement device configured to sense a voltage on the impedance matching network at a first network node;
   a second voltage measurement device configured to sense a voltage on the impedance matching network at a second network node, with the first and second network nodes being located on opposite sides of the series component;
   a network adjuster circuit configured to switch the impedance matching network between at least first and second states, wherein in the first state, first and second voltages are sensed on the respective first and second nodes and wherein in the second state, different from the first state, third and fourth voltages are sensed on the respective first and second nodes;
   processing circuitry configured to detect a change in antenna impedance while an antenna is coupled to the second port, based upon the first, second, third and fourth sensed voltages; and
   matching adjustment circuitry configured to control the at least one control signal so as to adjust the impedance matching network so as to at least partially compensate for the change in antenna impedance.

2. The impedance matching module of claim 1 wherein the adjustable impedance matching network includes at least three impedance components.

3. The impedance matching module of claim 1 wherein the network adjuster circuit is configured to switch the impedance matching network between the at least first and second states by adding and removing at least one network component to the adjustable impedance matching network.

4. The impedance matching module of claim 3 wherein the adjustable impedance matching network includes an inductor functioning as the at least one series component and first and second capacitances disposed on opposite sides of the inductor that function as the at least one parallel component and wherein the second capacitance is further disposed intermediate the inductor and the second port.

5. The impedance matching module of claim 4 wherein the first node for voltage sensing is disposed intermediate the inductor and the first port and the second node for voltage sensing is disposed intermediate the inductor and the second port.

6. The impedance matching module of claim 5 wherein the first node for voltage sensing is disposed at one end of the inductor and there second node for voltage sensing is disposed at another end of the inductor.

7. The impedance matching module of claim 5 wherein the network adjuster circuit is configured to increase the capacitance of the second capacitance when the impedance matching network is in one of the first and second states and to decrease the capacitance of the second capacitance when the impedance matching network in another one of the first and second states.

8. The impedance matching module of claim 7 further including a first attenuator circuit configured to provide an adjustable attenuation intermediate the first network node and the first voltage measurement device and a second attenuator circuit configured to provide an adjustable attenuation intermediate the second network node and the second voltage measurement device.

9. The impedance matching module of claim 8 wherein the first and second attenuator circuits each include a capacitive divider circuit.

10. The impedance matching module of claim 8 further including a signal strength detector and wherein the first and second attenuator circuits are responsive to the signal strength detector and are configured to increase the attenuation in response to an increase in a sensed RF signal and to decrease the attenuation in response to a decrease in the sensed RF signal.

11. The impedance matching of claim 4 wherein the matching adjustment circuitry is configured to adjust the impedance matching network by first adjusting the second capacitance and then adjusting the first capacitance so as to at least partially compensate for the change in antenna impedance.

12. An impedance matching module having a first port to be connected to an RF source and a second port to be connected to an antenna, said network comprising:
an impedance matching network having an input coupled to the first port and a output coupled to the second port, said impedance matching network including at least two impedance components including at least one series component and at least one parallel component;
a first voltage measurement device configured to sense a voltage on the impedance matching network at a first network node;
a second voltage measurement device configured to sense a voltage on the impedance matching network at a second network node, with the first and second network nodes being located on opposite sides of the series component;
a network adjuster circuit configured to switch the impedance matching network between at least first and second states, wherein in the first state, a first pair of matching network voltages are sensed and wherein in the second state, different from the first state, a second pair of matching network voltages are sensed different than the first pair; and
processing circuitry configured to detect a change in antenna impedance, while an antenna is coupled to the second port, based upon the first and second pair of network matching voltages.

13. The impedance matching module of claim 12 wherein the adjustable impedance matching network includes at least three impedance components.

14. The impedance matching module of claim 13 wherein the network adjuster circuit is configured to switch the impedance matching network between the at least first and second states by adding and removing at least one network component to and from the adjustable impedance matching network.

15. The impedance matching module of claim 14 wherein the impedance matching network includes an inductor functioning as the at least one series component and first and second capacitances disposed on opposite sides of the inductor that function as the at least one parallel component and wherein the second capacitance is further disposed intermediate the inductor and the second port.

16. The impedance matching module of claim 15 wherein the first node for voltage sensing is disposed intermediate the inductor and the first port and the second node for voltage sensing is disposed intermediate the inductor and the second port.

17. The impedance matching module of claim 16 wherein the first node for voltage sensing is disposed at one end of the inductor and where second node for voltage sensing is disposed at another end of the inductor.

18. The impedance matching module of claim 16 wherein the network adjuster circuit is configured to increase the capacitance of the second capacitance when the impedance matching network is in one of the first and second states and to decrease the capacitance of the second capacitance when the impedance matching network in another one of the first and second states.

* * * * *